United States Patent [19]
Ahmad et al.

[11] Patent Number: 5,818,984
[45] Date of Patent: Oct. 6, 1998

[54] OPTOELECTRONIC INTERCONNECTION OF INTEGRATED CIRCUITS

[75] Inventors: Umar M. Ahmad, Hopewell Junction, N.Y.; Eugene R. Atwood, Housatonic, Mass.

[73] Assignee: International Business Machines Corporation, Armonk, N.Y.

[21] Appl. No.: 751,603

[22] Filed: Nov. 18, 1996

[51] Int. Cl.⁶ .............................. G02B 6/12; H01L 27/15; H04B 10/00
[52] U.S. Cl. .............................. 385/14; 385/24; 385/147; 257/80; 257/84; 257/431; 257/432; 257/443; 359/157; 359/159
[58] Field of Search .............................. 385/14, 15, 17, 385/24, 27, 88, 89, 130, 131, 147; 257/80, 81, 82, 83, 84, 431, 432, 433, 443, 444; 372/43, 50; 359/154, 159

[56] References Cited

U.S. PATENT DOCUMENTS

| | | | |
|---|---|---|---|
| 4,070,516 | 1/1978 | Kaiser | 428/137 |
| 4,809,358 | 2/1989 | Fernström | 385/14 X |
| 4,939,793 | 7/1990 | Stewart | 385/14 X |
| 4,943,136 | 7/1990 | Popoff | 385/15 X |
| 5,009,476 | 4/1991 | Reid et al. | 385/14 |
| 5,061,027 | 10/1991 | Richard | 385/14 |
| 5,101,462 | 3/1992 | Richard | 385/37 |
| 5,159,700 | 10/1992 | Reid et al. | 385/14 |
| 5,200,631 | 4/1993 | Austin et al. | 257/381 |
| 5,208,879 | 5/1993 | Gallo et al. | 385/14 |
| 5,237,434 | 8/1993 | Feldman et al. | 359/19 |
| 5,394,490 | 2/1995 | Kato et al. | 385/14 |
| 5,408,547 | 4/1995 | Lebby et al. | 385/14 |
| 5,416,861 | 5/1995 | Koh et al. | 385/14 |
| 5,452,384 | 9/1995 | Kurita et al. | 385/33 |
| 5,469,286 | 11/1995 | Nicole | 359/163 |
| 5,568,574 | 10/1996 | Tanguay, Jr. et al. | 385/14 |

*Primary Examiner*—Brain Healy
*Attorney, Agent, or Firm*—DeLio & Peterson, LLC; Peter W. Peterson; Aziz M. Ahsan

[57] ABSTRACT

A microelectronic module comprising at least two chips mounted to a chip receiving surface. Each chip having an edge including at least one chip input and one chip output. The chips are arranged such that the edge of one chip is opposite the edge of the other chip. The chips are spaced apart by a predetermined distance. Each chip includes at least one optical transmitter attached to the edge of the chip. The transmitter has an input coupled to the chip output and a transmission portion for generating optical signals at a predetermined angle and that are representative of signals inputted to the transmitter input. The microelectronic module further includes at least one optical receiver attached to the edge of the chip. The optical receiver has an output coupled to the chip input and a receiving portion for directly receiving optical signals generated by a corresponding optical transmitter of the other chip. The optical receiver and the corresponding optical transmitter form a transmitter/receiver pair. The predetermined distance and the predetermined angle prevent overlapping of the optical signals of the transmitter/receiver pairs.

16 Claims, 3 Drawing Sheets

OPTOELECTRONIC INTERCONNECTION OF INTEGRATED CIRCUITS

BACKGROUND OF THE INVENTION

1. Field of the Invention

The present invention relates generally to the interconnection of integrated circuit chips in microelectronic modules.

2. Problem to be Solved

Presently, physical wire interconnections are used to effect electrical signal interconnection of integrated circuit chips in microelectronic modules such as multi-chip-module (MCM) or printed circuit board (PCB). However, physical wire interconnections have significant limitations when used to electronically connect chips. First, physical wire interconnections are expensive due to the process of fabrication involved, such as sputtering of tungsten, silver, gold, etc. Secondly, physical wire interconnections limit the inter-chip signal speed and bandwidth. Such a result can restrict the performance of the microelectronic modules. Thirdly, physical wire interconnections require significant switching current leading to noise problems due to current surge.

Bearing in mind the problems and deficiencies of physical wire interconnections, it is therefore an object of the present invention to provide an apparatus for interconnecting chips that costs relatively less to implement than physical wire connections.

It is another object of the present invention to provide an apparatus for interconnecting chips that enhances interchip signal speed and bandwidth.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a microelectronic module comprising:

a chip receiving surface; and at least two chips mounted to the chip receiving surface, each chip having an edge including at least one chip input and one chip output, the chips being arranged such that the edge of one chip is opposite the edge of the other chip, the chips being spaced apart by a predetermined distance, each chip including:

at least one optical transmitter attached to the edge of the chip, the transmitter having an input coupled to the chip output and a transmission portion for generating optical signals at a predetermined angle and which are representative of signals inputted to the transmitter input, and at least one optical receiver attached to the edge of the chip, the optical receiver having an output coupled to the chip input and a receiving portion for directly receiving optical signals generated by a corresponding optical transmitter of the other chip, the optical receiver and the corresponding optical transmitter forming a transmitter/receiver pair, the predetermined distance and the predetermined angle being of such magnitudes to prevent overlapping of the optical signals of the transmitter/receiver pairs.

In a related aspect, the present invention is directed to a microelectronic module, comprising:

a chip receiving surface; and at least two chips mounted to the chip receiving surface, each chip having an edge including at least one chip input and one chip output, the chips being arranged such that the edge of one chip is opposite the edge of the other chip, the chips being spaced apart by a predetermined distance, each chip including:

at least one optical transmitter formed in the edge of the chip, the transmitter having an input coupled to the chip output and a transmission portion for generating optical signals at a predetermined angle and which are representative of signals inputted to the transmitter input, and at least one optical receiver formed in the edge of the chip, the optical receiver having an output coupled to the chip input and a receiving portion for directly receiving optical signals generated by a corresponding optical transmitter of the other chip, the optical receiver and the corresponding optical transmitter forming a transmitter/receiver pair, the predetermined distance and the predetermined angle being of such magnitudes to prevent overlapping of the optical signals of the transmitter/receiver pairs.

In a further aspect, the present invention is directed to a microelectronic module, comprising:

a substrate; and at least two chips mounted to the substrate, each chip having an edge including at least one chip input and one chip output, the chips being arranged such that the edge of one chip is opposite the edge of the other chip, the chips being spaced apart by a predetermined distance, each chip including:

at least one light-emitting-diode attached to the edge of the chip, the light emitting diode having an input coupled to the chip output and a transmission portion for generating optical signals at a predetermined angle and which are representative of signals inputted to the transmitter input, and at least one photodiode attached to the edge of the chip, the photodiode having an output coupled to the chip input and a receiving portion for directly receiving optical signals generated by a corresponding optical transmitter of the other chip, the photodiode and the corresponding light-emitting diode forming an optical transmitter/receiver pair, the predetermined distance and the predetermined angle being of such magnitudes to prevent overlapping of the optical signals of the optical transmitter/receiver pairs.

In a related aspect, the present invention is directed to a microelectronic module, comprising:

a chip receiving surface; and at least two chips mounted to the chip receiving surface, each chip having an edge including at least one chip input and one chip output, the chips being arranged such that the edge of one chip is opposite the edge of the other chip, the chips being spaced apart by a distance between about 0.2 mm and 2.0 mm, each chip including:

at least one light-emitting-diode attached to the edge of the chip, the light emitting diode having an input coupled to the chip output and a transmission portion for generating substantially conical shaped optical signals at an angle between about 3° and 30° and which are representative of signals inputted to the transmitter input, and at least one photodiode attached to the edge of the chip, the photodiode having an output coupled to the chip input and a receiving portion for directly receiving optical signals generated by a corresponding optical transmitter of the other chip, the photodiode and the corresponding light-emitting diode forming an optical transmitter/receiver pair, the distance between chips and the optical signal angle cooperating to prevent overlapping of the optical signals of the optical transmitter/receiver pairs.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

In describing the preferred embodiment of the present invention, reference will be made herein to FIGS. 1–4 of the drawings in which like numerals refer to like features of the invention.

In accordance with the present invention, optical transmission and reception are used to effect interconnection of integrated circuits, such as flip-chips, mounted on a MCM or PCB. Optical transmitters (or emitters) and receiver are attached to or formed in the edge of each die or chip. The optical transmitters are coupled to chip outputs and the optical receivers are coupled to chip inputs. Each optical transmitter of one chip transmits optical signals across the gap or space between adjacent chips. The optical signals are directly received by corresponding optical receivers located in the edge of adjacent chips. Thus, the optical signals effect communication between adjacent chips without physical interconnections.

Figure 1:
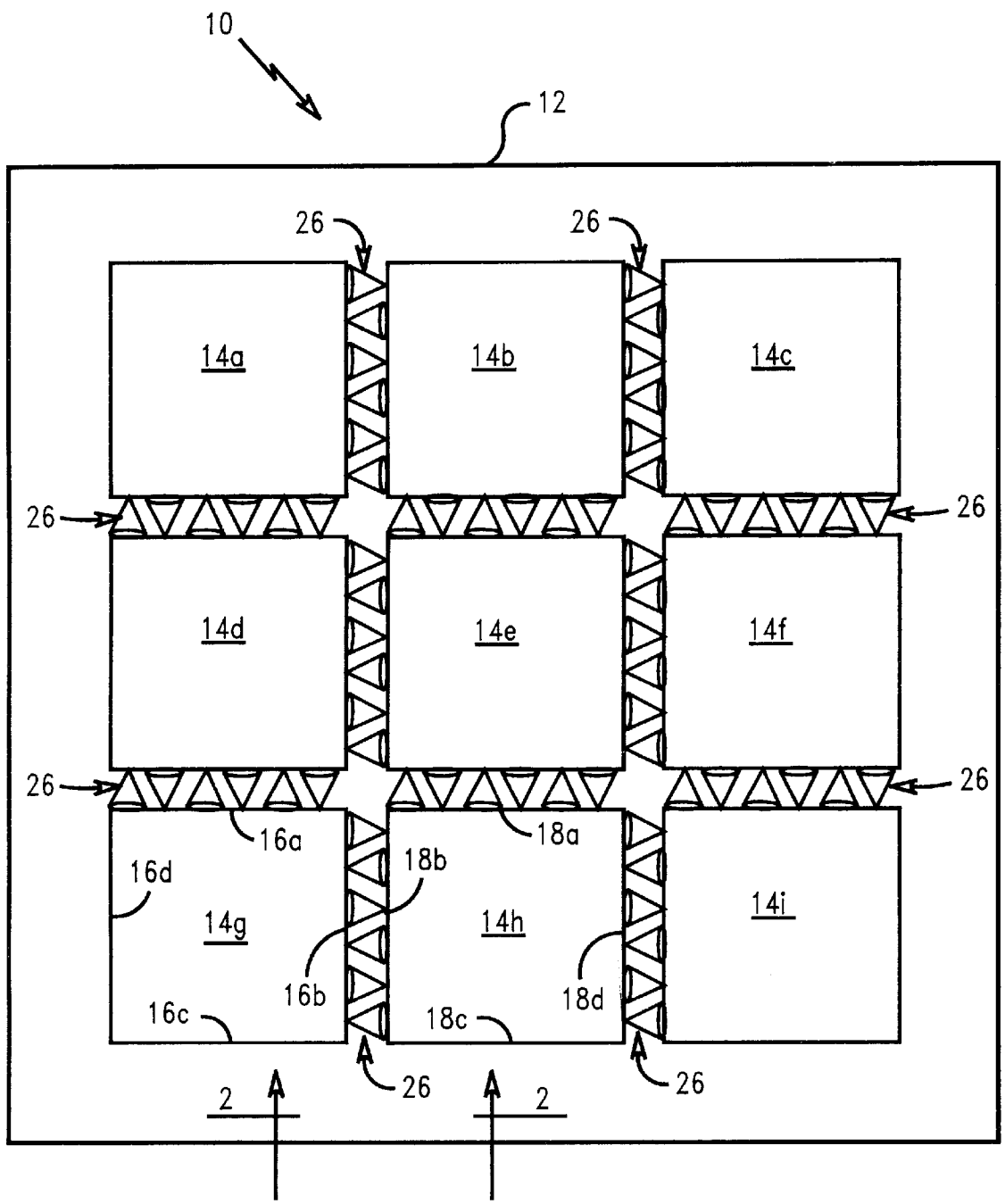
FIG. 1 is top plan view of a multi-chip module having a plurality of chips interconnected in accordance with the present invention.

Referring to FIGS. 1–3A, multi-chip module 10 comprises interconnection substrate 12 and an array of chips 14a–i arranged edge-to-edge. Chips 14a–i are connected to substrate 12 through pins 15. Pins 15 may be formed with controlled-collapse chip-connections (also known in the art as C4), conductive adhesive bumps or other pinless connectors generally referred to as surface mount technology. Each chip has a plurality of chip edges. For example, chip 14g has edges 16a–d and bottom surface 17 and chip 14h has edges 18a–d and bottom surface 19. To simplify the ensuing discussion, only chip edges 16a–d and 18a–d are discussed. However, it is to be understood that the chip-edges of the other chips shown in FIG. 1 are similarly constructed. Each chip-edge 16a–d is configured to have a plurality of optical transmitters (or emitters) and optical receivers (or detectors).

The optical transmitters and receivers can be either fabricated in the chip or attached to the chip. This will be discussed in detail below.

Figure 2:
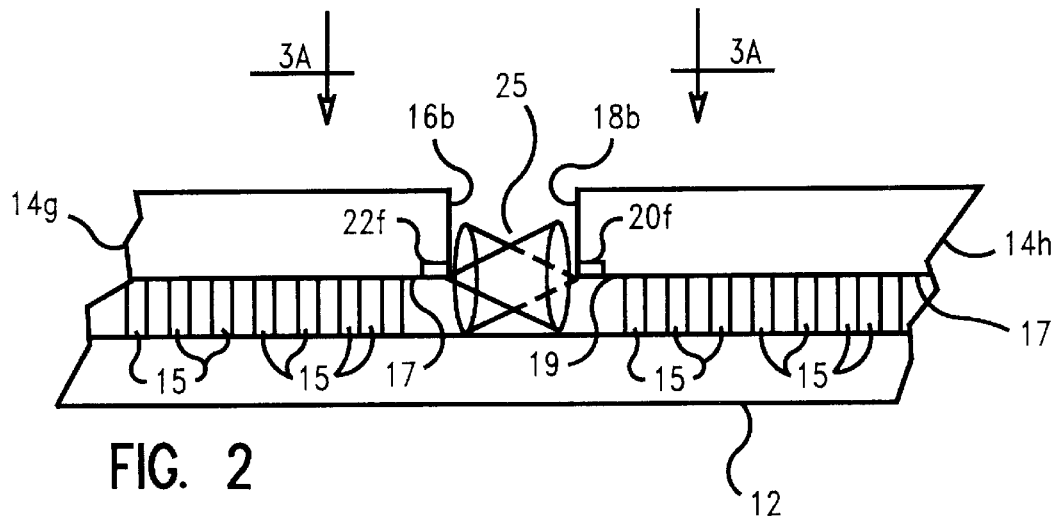
FIG. 2 is a side-elevational view taken along line 2—2 of FIG. 1.
Figure 3A:
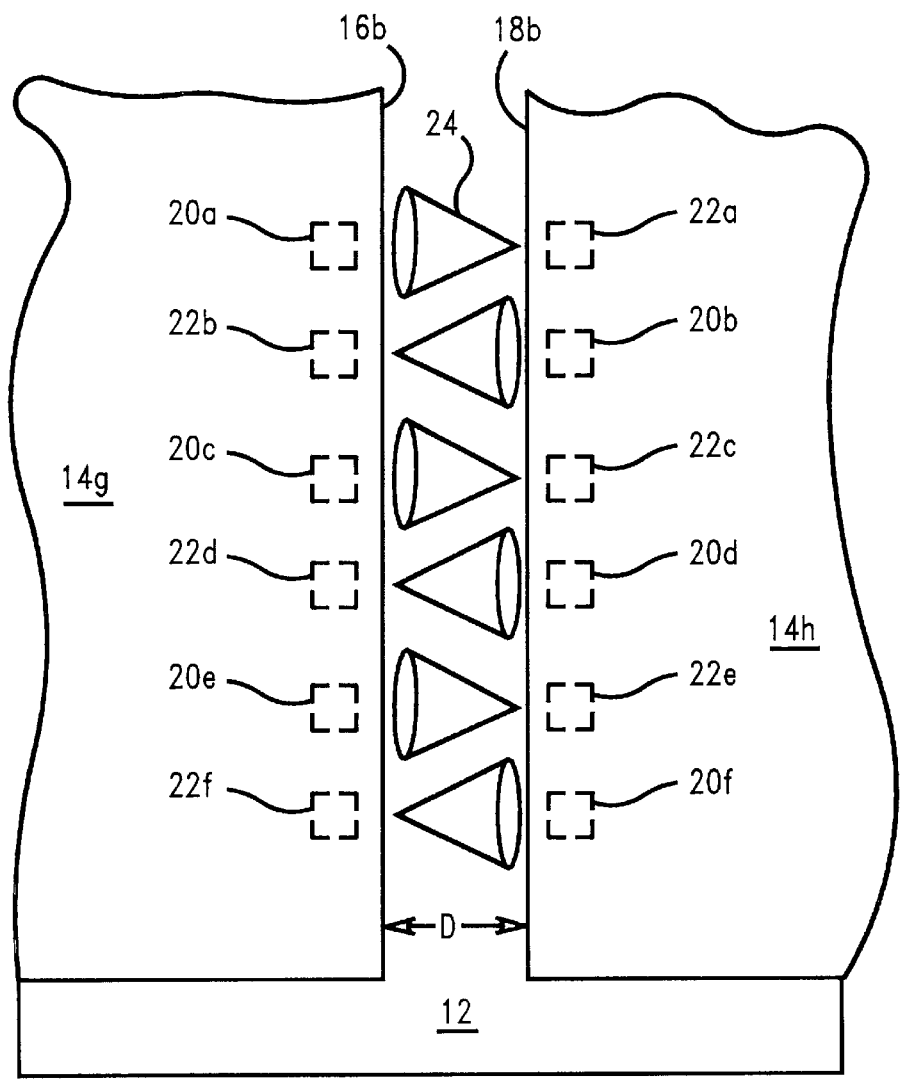
FIG. 3A is a top plan view along lines 3A–3A of FIG. 2.

Referring to FIGS. 2 and 3A, optical transmitters 20a–f and receivers 22a–f are alternately arranged on chips 14g and 14h. Transmitters 20a–f and receivers 22a–f are shown in phantom since these components are located in the bottom portion of the chip. Chip 14g has optical transmitters 20a, 20c, 20e and optical receivers 22b, 22d, 22f arranged in a linear array. Similarly, chip 14h has optical transmitters 20b, 20d, 20f and optical receivers 22a, 22c and 22e arranged in a linear array. Each optical transmitter of one chip transmits optical signals 24 directly across the narrow gap or free space 25 between the chips to a corresponding optical receiver on another chip. For example, optical transmitters 20a, 20c, and 20e of chip 14g transmit optical signals 24 directly to corresponding optical receivers 22a, 22c and 22e, respectively, on chip 14h. Similarly, optical transmitters 20b, 20d and 20f of chip 14h transmit optical signals 24 directly to optical receivers 22b, 22d and 22f, respectively, on chip 14g. The optical transmitters and the corresponding optical receivers form a plurality of transmitter/receiver pairs. The proximity of the chips and the relative received optical signal power contribute to the isolation of optical signals of adjacent optical transmitter/receiver pairs.

Center chip 14e has optical transmitters and receivers located on all four edges. The remaining chips have either two (2) or three (3) edges configured with optical transmitters and receivers. Thus, the number of chip-edges having optical transmitters and receivers depends upon the location of the chip in the array of chips.

It is highly preferable that the chips are spaced apart by a distance that will prevent overlapping of optical beams 24. Such spacing between chips determines emitter fan-out region 26 (see FIG. 1) between adjacent chips. Referring to FIG. 3, D refers to the distance or spacing between chips. Preferably, D is between about 0.2 mm (millimeter) and 2.0 mm. Such preferred chip spacing is feasible through the use of C4 or other surface mount interconnections.

Figure 3B:
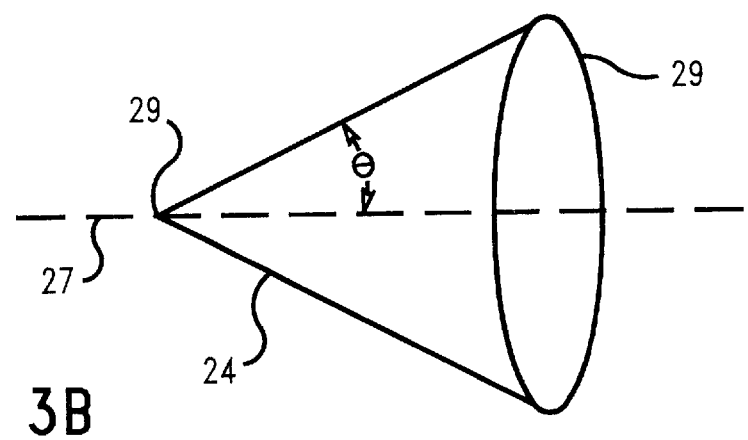
FIG. 3B is a perspective view of an optical beam generated by an optical transmitter.

Referring to FIG. 3B, angle $\theta$ of each optical beam generated by each optical transmitter is another factor that affects whether optical beams 24 of the optical transmitters overlap. Angle $\theta$ is measured with respect to center line 27 which intersects vertex 28 and circular plane 29. In a preferred embodiment, angle $\theta$ is preferably between about 3° and 30° in order to prevent overlapping of optical beams 24. Optical beam or signal 24 generated by each optical transmitter 20a–f is substantially conical in shape. Each optical receiver 22a–f is positioned such that it is substantially in the middle of circular plane 29 to maximize reception of the optical signals. In a preferred embodiment, the chips are aligned by the C-4 attachment method which provides sufficient alignment such that each optical receiver is positioned substantially in the middle of circular plane 29.

The number of transmitter/receiver pairs per unit length of chip edge is a function of the optical beam angle $\theta$ and the distance D between adjacent chips. As the spacing between chips and the angle of the optical beam or cone decreases, the more optical transmitter/receiver pairs can be implemented per millimeter of chip-edge. For example, a beam angle $\theta$ of 20° and chip-spacing of about 1.0 mm allows approximately three (3) transmitter/receiver pairs per millimeter of chip-edge. Thus, a 12 (twelve) mm square chip can support approximately 36 optical transmitter/receiver pairs per chip-edge.

In a preferred embodiment, each optical transmitter/receiver pair configuration is implemented with diodes wherein each optical transmitter is a light-emitting diode (LED) and each optical receiver is a light-receiving diode. It is highly preferably that such diodes are silicon diodes. In an alternate embodiment, the optical transmitters and receivers can be implemented with edge-emitting lasers. The edge-emitting lasers as well as the diodes may be fabricated in the chip material or attached to the chips by die bonding the lasers or diodes to conductive pads on the bottom surface of the chip. If the optical transmitters and receivers are to be fabricated in the chip, the transmitters and receivers are preferably located on the bottom portion of the chip and integral with bottoms surfaces 17 and 19 of chips 14g and 14h.

If edge-emitting lasers are to be used to implement the optical transmitters and receivers, then it is preferred that GaAs (gallium arsenide) or other binary semiconductor direct band-gap based electronics be utilized with C4 or surface mount (die bond) attachment processes to implement such lasers. Such GaAs edge-emitting lasers would facilitate achievement of optimum performance of the microelectronic module, i.e. MCM or PCB. due to the direct band-gap property and relatively high switching speed of GaAs electronics.

Figure 4:
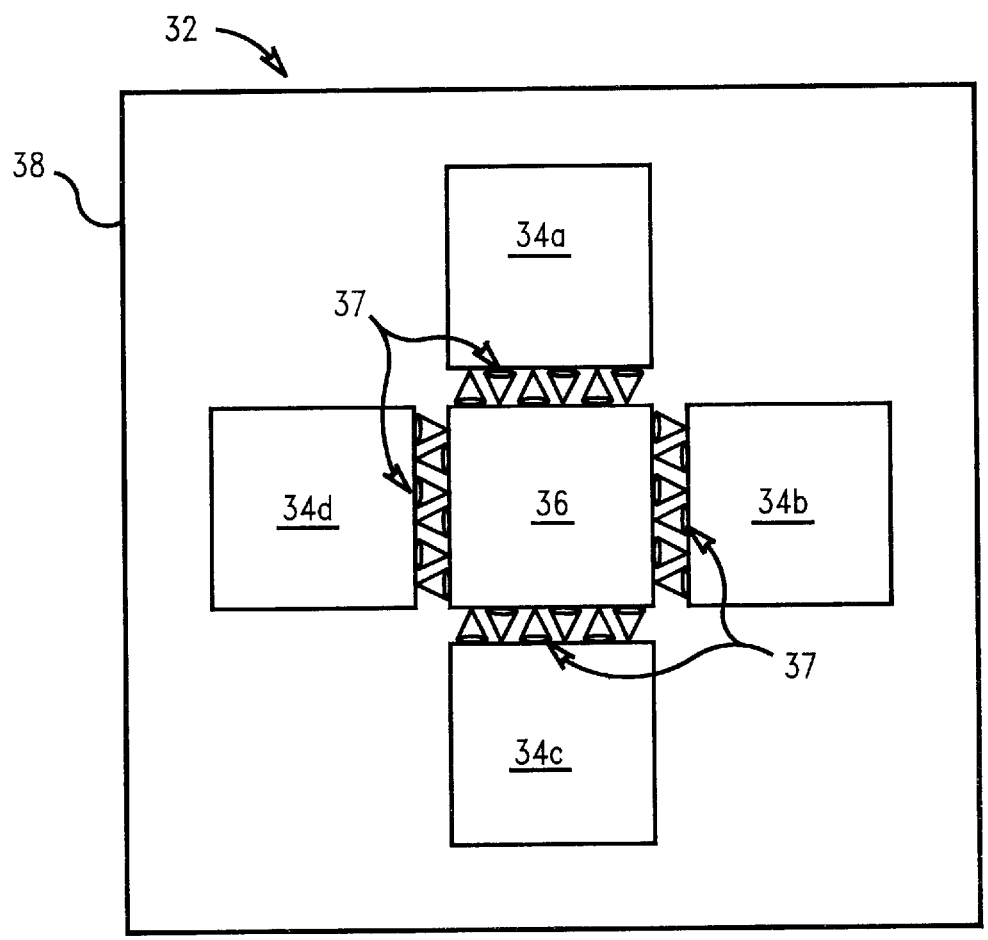
FIG. 4 is a top plan view of a multi-chip module configured as a processor having a plurality of chips interconnected in accordance with the present invention.

Referring to FIG. 4, an example of an implementation of the present invention is shown. Data processing system 32 comprises flip-chips 34a–d and 36 which are mounted to substrate 38. Chip 36 is a processor such as an application specific integrated circuit (ASIC) or digital signal processor (DSP). Chip 36 also includes a relatively large cache memory. Each of the surrounding chips 34a–d is a relatively large memory chip, such as a static random access memory (SRAM). The optical transmitter or emitter regions between adjacent chips are designated by numeral 37. If the cache memory of processor chip 36 is 64 bits wide and 500 kbytes deep (4 MB), than the linear array of optical transmitters on each side of chip 36 is organized as 20 address lines, 16 data lines and several control lines. If the processor speed is about 30 Mhz and each optical transmitter/receiver pair operates at this processor speed, then the signal bandwidth to the cache memory of chip 36 can operate between 19.2 Gbits/sec. and 2.4 Gbytes/sec., inclusive.

The optical signal transmission and reception configuration of the present invention may be used in combination with physical interconnections. For example, optical signal generation and reception in accordance with the present invention may be used to effect communication between adjacent chips of an array whereas physical interconnections are used to effect communication between chips separated by longer distances.

Thus, the optical transmission and reception configuration in accordance with the present invention offers the following advantages:

a) reduces manufacturing time and costs;
b) significantly improves signal bandwidth;
c) provides the shortest possible horizontal path interconnection between adjacent chips thereby reducing package size;
d) reduces switching current surges;
e) allows replacement of off-chip line drivers with optical transmitter/receiver pairs to further decrease switching current surges;
f) uses the free space between chips or filled epoxy space as the transmissive media and the close proximity of the chips to avoid the use of radiation guide structures;
g) use of broad band electromagnetic radiation from a variety of sources;
h) can be implemented through an attachment or wafer fabrication process;
i) allows components of the module to be readily assembled with lateral alignment tolerances required for establishing precision optical interconnections; and
j) allows use of conventional solder bump and reflow techniques, also known as flip-chip or C4 bonding.

Although the present invention has been described in terms of optical interconnections between chips on the same microelectronic module, the concept of the present invention may be expanded to optical interconnections between adjacent modules.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A microelectronic module, comprising:
a chip receiving surface; and
at least two chips mounted to the chip receiving surface, each chip having an edge including at least one chip input and one chip output, the chips being arranged such that the edge of one chip is opposite the edge of the other chip, the chips being spaced apart by a predetermined distance, each chip including:
at least one optical transmitter attached to the edge of the chip, the transmitter having an input coupled to the chip output and a transmission portion for generating optical signals at a predetermined angle and which are representative of signals inputted to the transmitter input, and
at least one optical receiver attached to the edge of the chip, the optical receiver having an output coupled to the chip input and a receiving portion for directly receiving optical signals generated by a corresponding optical transmitter of the other chip,
the optical receiver and the corresponding optical transmitter forming a transmitter/receiver pair, the predetermined distance and the predetermined angle being of such magnitudes to prevent overlapping of the optical signals of the transmitter/receiver pairs.

2. A microelectronic module, comprising:
a chip receiving surface; and
at least two chips mounted to the chip receiving surface, each chip having an edge including at least one chip input and one chip output, the chips being arranged such that the edge of one chip is opposite the edge of the other chip, the chips being spaced apart by a predetermined distance, each chip including:
at least one optical transmitter formed in the edge of the chip, the transmitter having an input coupled to the chip output and a transmission portion for generating optical signals at a predetermined angle and which are representative of signals inputted to the transmitter input, and
at least one optical receiver formed in the edge of the chip, the optical receiver having an output coupled to the chip input and a receiving portion for directly receiving optical signals generated by a corresponding optical transmitter of the other chip,
the optical receiver and the corresponding optical transmitter forming a transmitter/receiver pair, the predetermined distance and the predetermined angle being of such magnitudes to prevent overlapping of the optical signals of the transmitter/receiver pairs.

3. The microelectronic module according to claim 1 wherein each optical transmitter comprises a light-emitting diode.

4. The microelectronic module according to claim 1 wherein each optical receiver comprises a photodiode.

5. The microelectronic module according to claim 1 wherein each optical transmitter comprises an edge-emitting laser.

6. The microelectronic module according to claim 1 wherein each chip has conductive pads on the chip bottom surface that are coupled to the chip inputs and outputs, the inputs of the optical transmitters being die bonded to the conductive pads couple to the output of the chips, the outputs of the optical receivers being die bonded to the conductive pads coupled to the inputs of the chips.

7. A microelectronic module, comprising:

a chip receiving surface; and at least two chips mounted to the chip receiving surface, each chip having an edge including at least one chip input and one chip output, the chips being arranged such that the edge of one chip is opposite the edge of the other chip, the chips being spaced apart wherein the spacing of the chips is between about 0.2 mm and 2.0 mm, each chip including:

at least one optical transmitter attached to the edge of the chip, the transmitter having an input coupled to the chip output and a transmission portion for generating optical signals at a predetermined angle and which are representative of signals inputted to the transmitter input, and at least one optical receiver attached to the edge of the chip, the optical receiver having an output coupled to the chip input and a receiving portion for directly receiving optical signals generated by a corresponding optical transmitter of the other chip, the optical receiver and the corresponding optical transmitter forming a transmitter/receiver pair, the predetermined distance and the predetermined angle being of such magnitudes to prevent overlapping of the optical signals of the transmitter/receiver pairs.

8. The microelectronic module according to claim 1 wherein the optical signal generated by each optical transmitter is substantially conical in shape.

9. A microelectronic module, comprising:

a chip receiving surface; and at least two chips mounted to the chip receiving surface, each chip having an edge including at least one chip input and one chip output, the chips being arranged such that the edge of one chip is opposite the edge of the other chip, the chips being spaced apart by a predetermined distance, each chip including:

at least one optical transmitter attached to the edge of the chip, the transmitter having an input coupled to the chip output and a transmission portion for generating optical signals wherein the optical signal generated by each optical transmitter is substantially conical in shape wherein the angle of the optical signal is between about 3° and 30° with respect to a reference line intersecting the vertex of the cone and the centerpoint of the circular end of the cone; and which are representative of signals inputted to the transmitter input, and at least one optical receiver attached to the edge of the chip, the optical receiver having an output coupled to the chip input and a receiving portion for directly receiving optical signals generated by a corresponding optical transmitter of the other chip, the optical receiver and the corresponding optical transmitter forming a transmitter/receiver pair, the predetermined distance and the predetermined angle being of such magnitudes to prevent overlapping of the optical signals of the transmitter/receiver pairs.

10. The microelectronic module according to claim 1 wherein the at least one input and output of each chip comprises a plurality of inputs and outputs, respectively, and wherein the at least one optical transmitter of each chip comprises a plurality of optical transmitters and the at least one optical receiver of each chip comprises a plurality of optical receivers, the plurality of optical transmitters and receivers being arranged in a linear array.

11. The microelectronic module according to claim 2 wherein the optical transmitters and receivers are fabricated within the chip.

12. The microelectronic module according to claim 11 wherein each chip has a bottom surface opposing the chip-receiving surface, the optical transmitters and receivers being integral with the chip edge and chip bottom surface.

13. A microelectronic module, comprising:

a substrate having a surface; and at least two chips mounted to the substrate, each chip having an edge including at least one chip input and one chip output, the chips being arranged such that the edge of one chip is opposite the edge of the other chip, the chips being spaced apart by a predetermined distance, each chip including:

at least one light-emitting-diode attached to the edge of the chip, the light emitting diode having an input coupled to the chip output and a transmission portion for generating optical signals at a predetermined angle and which are representative of signals inputted to the transmitter input, and at least one photodiode attached to the edge of the chip, the photodiode having an output coupled to the chip input and a receiving portion for directly receiving optical signals generated by a corresponding optical transmitter of the other chip, the photodiode and the corresponding light-emitting diode forming an optical transmitter/receiver pair for transmitting and receiving signals above the substrate surface, the predetermined distance and the predetermined angle being of such magnitudes to prevent overlapping of the optical signals of the optical transmitter/receiver pairs.

14. A microelectronic module, comprising:

a chip receiving surface; and at least two chips mounted to the chip receiving surface, each chip having an edge including at least one chip input and one chip output, the chips being arranged such that the edge of one chip is opposite the edge of the other chip, the chips being spaced apart by a distance between about 0.2 mm and 2.0 mm, each chip including:

at least one light-emitting-diode attached to the edge of the chip, the light emitting diode having an input coupled to the chip output and a transmission portion for generating substantially conical shaped optical signals at an angle between about 3° and 30° and which are representative of signals inputted to the transmitter input, and at least one photodiode attached to the edge of the chip, the photodiode having an output coupled to the chip input and a receiving portion for directly receiving optical signals generated by a corresponding optical transmitter of the other chip, the photodiode and the corresponding light-emitting diode forming an optical transmitter/receiver pair, the distance between chips and the optical signal angle cooperating to prevent overlapping of the optical signals of the optical transmitter/receiver pairs.

15. The microelectronic module according to claim 1 wherein the transmitter/receiver pair are adapted to transmit and receive said optical signals above said chip receiving surface.

16. The microelectronic module according to claim 2 wherein the transmitter/receiver pair are adapted to transmit and receive said optical signals above said chip receiving surface.

* * * * *